(12) United States Patent
Shiliang et al.

(10) Patent No.: US 10,685,838 B1
(45) Date of Patent: Jun. 16, 2020

(54) SEMICONDUCTOR STRUCTURE PROVIDING FOR AN INCREASED PATTERN DENSITY ON A SUBSTRATE AND METHOD FOR FORMING SAME

(71) Applicants: Semiconductor Manufacturing International (Beijing) Corporation, Beijing (CN); Semiconductor Manufacturing International (Shanghai) Corporation, Shanghai (CN)

(72) Inventors: Ji Shiliang, Shanghai (CN); Zhang Yiying, Shanghai (CN); Zhang Haiyang, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/542,563

(22) Filed: Aug. 16, 2019

(30) Foreign Application Priority Data

Dec. 26, 2018 (CN) .......................... 2018 1 1604233

(51) Int. Cl.
*H01L 21/033* (2006.01)
*H01L 27/088* (2006.01)
(Continued)

(52) U.S. Cl.
CPC ...... *H01L 21/0338* (2013.01); *H01L 21/0276* (2013.01); *H01L 21/0332* (2013.01);
(Continued)

(58) Field of Classification Search
None
See application file for complete search history.

(56) References Cited

U.S. PATENT DOCUMENTS

| 9,209,038 | B2 * | 12/2015 | Cantone | H01L 21/823431 |
| 2015/0041812 | A1 * | 2/2015 | Cheng | H01L 27/0886 |
| | | | | 257/57 |
| 2015/0318181 | A1 * | 11/2015 | Cantone | H01L 21/823431 |
| | | | | 438/702 |

\* cited by examiner

*Primary Examiner* — J. E. Schoenholtz
(74) *Attorney, Agent, or Firm* — Brinks Gilson & Lione (57) ABSTRACT

Disclosed are a semiconductor structure and a method for forming the same. The method includes: providing a base, including a first region and a second region, where a pitch between target patterns formed on the first region is greater than a pitch between target patterns formed on the second region; forming a bottom core material layer on the base; forming first core layers on the bottom core material layer; forming a first mask sidewall on a sidewall of the first core layer of the first region, and forming a second mask sidewall on a sidewall of the first core layer of the second region, where the thickness of the second mask sidewall is greater than the thickness of the first mask sidewall; removing the first core layers; patterning the bottom core material layer by using the first mask sidewall and the second mask sidewall as masks, to form a second core layer; removing the first mask sidewall and the second mask sidewall; forming a third mask sidewall on a sidewall of the second core layer; removing the second core layer; and patterning the base by using the third mask sidewall as a mask, to form target patterns protruding out of a residual base. The present disclosure meets the requirement of different pitches of the target patterns.

18 Claims, 7 Drawing Sheets

(51) Int. Cl.
*H01L 29/10* (2006.01)
*H01L 21/8234* (2006.01)
*H01L 21/027* (2006.01)

(52) U.S. Cl.
CPC ...... *H01L 21/0335* (2013.01); *H01L 21/0337* (2013.01); *H01L 21/823412* (2013.01); *H01L 21/823431* (2013.01); *H01L 27/0886* (2013.01); *H01L 29/1037* (2013.01)

SEMICONDUCTOR STRUCTURE PROVIDING FOR AN INCREASED PATTERN DENSITY ON A SUBSTRATE AND METHOD FOR FORMING SAME

RELATED APPLICATIONS

The present application claims priority to Chinese Patent Appln. No. 201811604233.7, filed Dec. 26, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

A photolithography technology is a common patterning method, and is the most crucial production technology in a semiconductor manufacturing process. With the continuous reduction of nodes of a semiconductor process, a self-aligned double patterning (SADP) method has become a patterning method preferred in recent years. The method can increase the density of patterns formed on a substrate, to further shorten a pitch between neighboring two patterns, so that a photolithography process overcomes limits of the photolithography resolution.

With the continuous reduction of critical dimensions (CDs) of patterns, a self-aligned quadruple patterning (SAQP) method emerges. The density of the patterns formed on the substrate using the SADP method is double the density of patterns formed on the substrate using the photolithography process, that is, a ½ smallest pitch (½ pitch) may be obtained. On the premise that the current photolithography technology is unchanged (that is, the size of a photolithography window is unchanged), the density of the patterns formed on the substrate using the SAQP method is quadruple the density of the patterns formed on the substrate using the photolithography process. That is, a ¼ smallest pitch (¼ pitch) may be obtained, thereby significantly improving the density of integrated circuits of the semiconductor, and shortening the CDs of the patterns, to further help improve the device performance.

SUMMARY

The problem to be addressed in embodiments and implementations of the present disclosure is to provide a semiconductor structure and a method for forming same, to meet the requirement of different pitches of target patterns.

To address the foregoing problem, one form of the present disclosure provides a method for forming a semiconductor structure. The method may include: providing a base, used to form target patterns, where the base includes a first region and a second region, and a pitch between target patterns formed on the first region is greater than a pitch between target patterns formed on the second region; forming a bottom core material layer on the base; forming a plurality of discrete first core layers on the bottom core material layer; forming a first mask sidewall on a sidewall of the first core layer of the first region, and forming a second mask sidewall on a sidewall of the first core layer of the second region, where a thickness of the second mask sidewall is greater than a thickness of the first mask sidewall; removing the first core layers; after the first core layers are removed, patterning the bottom core material layer by using the first mask sidewall and the second mask sidewall as masks, to form a plurality of discrete second core layers; removing the first mask sidewall and the second mask sidewall; after the first mask sidewall and the second mask sidewall are removed, forming a third mask sidewall on a sidewall of the second core layer; removing the second core layers; and after the second core layers are removed, patterning the base by using the third mask sidewall as a mask, to form a plurality of target patterns protruding out of a residual base.

Another form of the present disclosure provides a semiconductor structure. The semiconductor structure may include: a substrate and a plurality of discrete fins protruding out of the substrate, where the substrate includes a core region and a peripheral region, and a pitch between fins located in the peripheral region is greater than a pitch between fins located in the core region.

Compared with the prior art, the technical solutions of embodiments and implementations of the present disclosure have the following advantages:

In embodiments and implementations of the present disclosure, after the plurality of discrete first core layers is formed on the bottom core material layer, a first mask sidewall is formed on the sidewall of the first core layer of the first region, and a second mask sidewall is formed on the sidewall of the first core layer of the second region, where the thickness of the second mask sidewall is greater than the thickness of the first mask sidewall. Subsequently, the bottom core material layer is patterned using the first mask sidewall and the second mask sidewall as masks, to form a second core layer, and then, a third mask sidewall is formed on the sidewall of the second core layer, and used as a mask for patterning the base to form target patterns. Patterns are transferred to the second core layer through the first mask sidewall and the second mask sidewall, the third mask sidewall is formed on the sidewall of the second core layer, and the patterns are transferred to the base through the third mask sidewall, to form the target patterns. Therefore, the first mask sidewall and the second mask sidewall are used to define the spacer between neighboring target patterns, the thickness of the second mask sidewall is greater than the thickness of the first mask sidewall, and the spacer between the target patterns of the second region is correspondingly greater than the spacer between the target patterns of the first region, so that the pitch between the target patterns of the second region is greater than the pitch between the target patterns of the first region, to meet the requirement of different pitches of the target patterns.

In some implementations, the formed target patterns are fins, the first region is a core region, and the second region is a peripheral region. The core region is used to form a core device, the peripheral region is used to form an input/output device (IO device), and the thickness of a gate dielectric layer of the IO device is usually greater than the thickness of a gate dielectric layer of the core device. The pitch between the fins of the second region is made to be greater than the pitch between the fins of the first region, to provide sufficient space for forming the gate dielectric layer corresponding to the IO device. The pitch between the fins of the first region is still relatively small, to save the area, and avoid affecting the improvement of the device integration.

DETAILED DESCRIPTION

With the continuous reduction of CDs of patterns, an SAQP method is usually selected to form target patterns, so that the target patterns can obtain a ¼ pitch on a premise of not changing the current photolithography technology. Although the SAQP method can reduce the pitch between the target patterns, the pitches between the target patterns are equal, and the requirement of different pitches of regions cannot be met.

To address the technical problem, in embodiments and implementations of the present disclosure, after the first core layers are formed on the bottom core material layer, a first mask sidewall is formed on the sidewall of the first core layer of the first region, and a second mask sidewall is formed on the sidewall of the first core layer of the second region, where the thickness of the second mask sidewall is greater than the thickness of the first mask sidewall. Subsequently, the bottom core material layer is patterned using the first mask sidewall and the second mask sidewall as masks, to form a second core layer, and then, a third mask sidewall is formed on the sidewall of the second core layer, and used as a mask for patterning the base to form target patterns. Patterns are transferred to the second core layer using the first mask sidewall and the second mask sidewall, the third mask sidewall is formed on the sidewall of the second core layer, and the patterns are transferred to the base using the third mask sidewall, to form the target patterns. The first mask sidewall and the second mask sidewall are used to define the spacer between neighboring target patterns, the thickness of the second mask sidewall is greater than the thickness of the first mask sidewall, and the spacer between the target patterns of the second region is correspondingly greater than the spacer between the target patterns of the first region, so that the pitch between the target patterns of the second region is greater than the pitch between the target patterns of the first region, to meet the requirement of different pitches of the target patterns.

To make the foregoing objectives, features, and advantages of the embodiments and implementations of the present disclosure clearer and more comprehensible, the following describes specific embodiments and implementations of the present disclosure in detail with reference to the accompanying drawings.

FIG. 1 to FIG. 15 are schematic structural diagrams corresponding to steps in one form of a method for forming a semiconductor structure.

Figure 1:
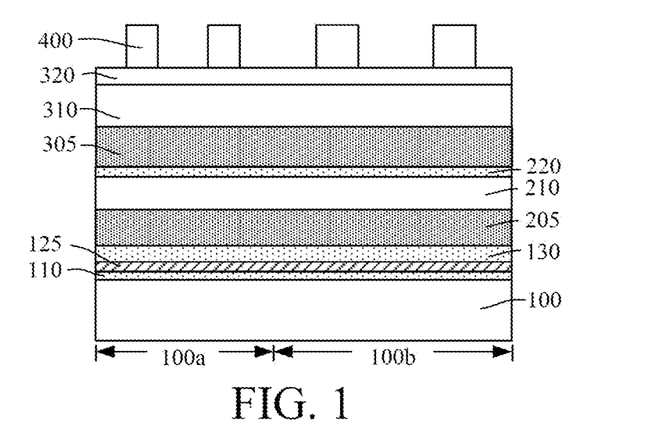
FIG. 1 to FIG. 15 are schematic structural diagrams corresponding to steps in one form of a method for forming a semiconductor structure.

Referring to FIG. 1, a base 100 is provided, used to form target patterns, where the base 100 includes a first region 100a and a second region 100b, and the pitch between the target patterns formed on the first region 100a is greater than the pitch between the target patterns formed on the second region 100b.

In some implementations, the base 100 is used to form a substrate and fins located on the substrate, that is, the formed target patterns are the fins.

In some implementations, the material of the base 100 is Si. In other implementations, the material of the base may also be another material such as Ge, SiGe, SiC, GaAs, or InGa. The base may also be a base of another type, such as a Si base on an insulator or a Ge base on an insulator. In some other implementations, the base may further include a first semiconductor layer and a second semiconductor layer epitaxially growing on the first semiconductor layer, where the first semiconductor layer is used to provide a process foundation for subsequently forming the substrate, and the second semiconductor layer is used to provide a process foundation for subsequently forming the fins. In other implementations, the base may further include other to-be-etched functional layers, for example, a gate material layer.

The base 100 includes a first region 100a and a second region 100b, and the pitch between target patterns subsequently formed on the first region 100a is greater than the pitch between the target patterns formed on the second region 100b.

In some implementations, the first region 100a is a core region, the second region 100b is a peripheral region, that is, the first region 100a is used to form a core device, and the second region 100b is used to form an IO device. The core device mainly refers to a device used inside a chip, and usually uses a relatively low voltage (which is generally 1.0 V, 1.2 V, 1.5 V, or 1.8 V). The IO device is a device used when the chip interacts with an external interface. The working voltage of such a device is generally relatively high, and depends on a compatible working voltage (which is generally 1.8 V, 2.5 V, 3.3 V, or 5V) of the external interface. In other implementations, the first region and the second region may also be used to form other types of devices, and the device types may also be the same.

Still referring to FIG. 1, a pad oxide layer 110 is formed on the base 100; and a lapping stopping layer 125 is formed on the pad oxide layer 110.

In a lapping process of subsequently forming an isolation structure, the top of the lapping stopping layer 125 is used to define a stopping position of the lapping process. In some implementations, the material of the lapping stopping layer 125 is SiN.

The pad oxide layer 110 is used to provide a cushioning effect in forming of the lapping stopping layer 125, to avoid a dislocation problem caused when the lapping stopping layer 125 is directly formed on the base 100. In some implementations, the material of the pad oxidation layer 110 is SiO.

Still referring to FIG. 1, a bottom core material layer 205 is formed on the lapping stopping layer 125.

The bottom core material layer 205 is used to provide a process foundation for subsequently forming a second core layer. A third mask sidewall subsequently formed on a sidewall of the second core layer is used as a mask for patterning the base 100.

The second core layer is further removed subsequently. Therefore, the bottom core material layer 205 is an easily removed material, and the process of removing the second core layer does less damage to other film layers. In some implementations, the material of the bottom core material layer 205 is a-Si. a-Si is a core layer material commonly used in an SAQP process. In some other implementations, the material of the bottom core material layer is SiN. In other implementations, the material of the bottom core material layer may also be a-C, a-Ge, SiO, SiON, CN, Poly-Si, SiC, SiCN, SiOCN, or an organic dielectric layer (ODL) material.

In some implementations, the method further includes: before the bottom core material layer 205 is formed, forming a first etching stopping layer 130 on the lapping stopping layer 125. The third mask sidewall subsequently formed on the sidewall of the second core layer is formed using a process combining deposition and etching, and the top face of the first etching stopping layer 130 is used to define the stopping position of the etching process, to avoid causing an overetching problem, thereby reducing the probability of the height inconsistency problem of the top faces of to-be-etched film layers below the stopping position, so that the height and the morphology of the subsequently formed target patterns can meet the process requirement.

In some implementations, according to the material of the bottom core material layer 205, the material of the first etching stopping layer 130 is SiO. In other implementations, the material may also be SiN or SiON.

Figure 2:
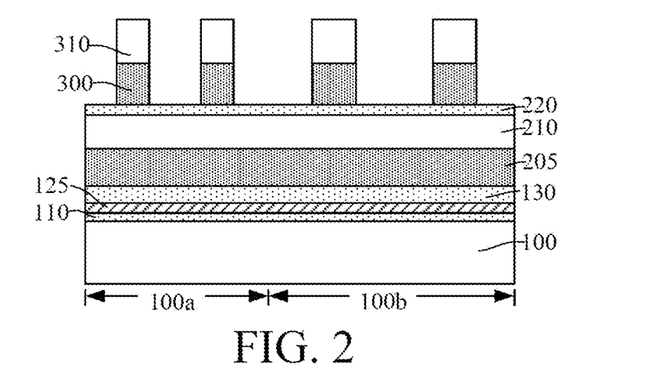
Figure 3:
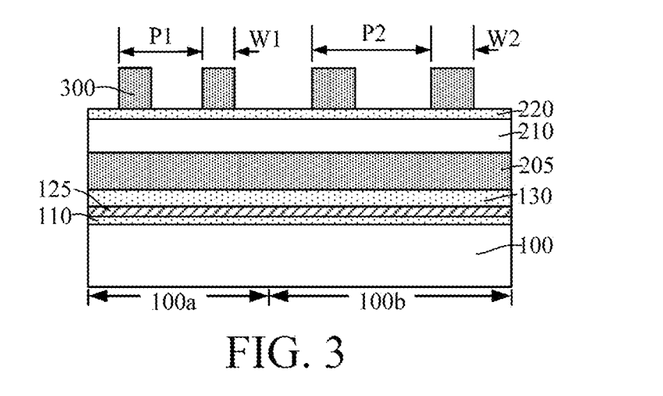

Referring to FIG. 1 to FIG. 3, a plurality of discrete first core layers 300 (as shown in FIG. 3) is formed on the bottom core material layer 205.

The first core layer 300 is used to provide a process foundation for subsequently forming the first mask sidewall and the second mask sidewall. Subsequently, the first mask sidewall is formed on the sidewall of the first core layer 300 of the first region 100a, and used to define the spacer between the target patterns formed on the first region 100a. The second mask sidewall is formed on the sidewall of the first core layer 300 of the second region 100b, and used to define the spacer between the target patterns formed on the second region 100b.

After the first mask sidewall and the second mask sidewall are formed, the first core layer 300 is further removed. Therefore, the first core layer 300 is an easily removed material, and the process of removing the first core layer 300 does less damage to other film layers. In some implementations, the material of the first core layer 300 is a-Si. In some other implementations, the material of the bottom core material layer is SiN. In other implementations, the material of the bottom core material layer may also be a-C, a-Ge, SiO, SiON, CN, Poly-Si, SiC, SiCN, SiOCN, or an ODL material.

The first core layers 300 have a first preset pitch, and the target patterns subsequently formed in the same region have a second preset pitch. In the SAQP process, the target patterns can obtain the ¼ pitch on the premise of not changing the current photolithography technology. Therefore, in the same region, the first preset pitch is quadruple of the second preset pitch. That is, in the first region 100a, the first preset pitch P1 (as shown in FIG. 3) of the first core layers 300 is quadruple of the second preset pitch of the target patterns. In the second region 100b, the first preset pitch P2 (as shown in FIG. 3) of the first core layers 300 is quadruple of the second preset pitch of the target patterns.

The first core layer 300 has a first preset width, and the target pattern has a second preset width. The first mask sidewall is used to define the spacer between the target patterns on the first region 100a, the second mask sidewall is used to define the spacer between the target patterns on the second region 100b, and the first mask sidewall and the second mask sidewall are respectively formed on the sidewalls of the first core layers 300 of the first region 100a and the second region 100b. Therefore, in the same region, the first preset width is equal to the sum of the second preset width and the second preset pitch. The first preset width refers to the size of the first core layer 300 in a direction perpendicular to the sidewall of the first core layer 300.

Specifically, in the first region 100a, a first preset width W1 (as shown in FIG. 3) of the first core layer 300 is the sum of the second preset width and the second preset pitch of the target patterns of the corresponding region. Likewise, in the second region 100b, a first preset width W2 (as shown in FIG. 3) of the first core layer 300 is the sum of the second preset width and the second preset pitch of the target patterns of the corresponding region.

In some implementations, the second preset pitch of the first region 100a is less than the second preset pitch of the second region 100b. Therefore, a first preset pitch P1 of the first region 100a is less than a first preset pitch P2 of the second region 100, a first preset width W1 of the first region 100a is less than a first preset width W2 of the second region 100b, the difference between the first preset pitches of the two regions is quadruple of the difference between the second preset pitches of the two regions, and the difference between the first preset widths of the two regions is the difference between the second preset pitches of the two regions.

Specifically, the step of forming the first core layer 300 includes: forming a top core material layer 305 (as shown in FIG. 1) on the bottom core material layer 205; forming a flat layer 310 on the top core material layer 305; forming an anti-reflective coating layer 320 on the flat layer 310; forming a patterned first photoresist layer 400 on the anti-reflective coating layer 320; and etching the anti-reflective coating layer 320, the flat layer 310, and the top core material layer 305 sequentially by using the first photoresist layer 400 as a mask, and using the residual top core material layer 305 as the first core layer 300.

The anti-reflective coating layer 320 is used to reduce the reflection effect during exposure, thereby improving the pattern transfer precision, and further improving the morphology quality and the size accuracy of the first photoresist layer 400. In some implementations, the anti-reflective coating layer 320 is a Si-ARC layer.

The top face of the flat layer 310 is a flat face, and used to improve the surface flatness of the anti-reflective coating layer 320, thereby improving the morphology quality and the size accuracy of the first photoresist layer 400. In some implementations, the flat layer 310 is a spin on carbon (SOC) layer. The SOC layer is formed by using a spin coating process. The process costs are relatively low, and can ensure the surface flatness of the flat layer 310. In other implementations, the material of the flat layer may also be SiO.

It should be noted that, in the pattern transfer procedure, the first photoresist layer 400 and the anti-reflective coating layer 320 may also have losses. In some implementations, after the first core layer 300 is formed, both the first photoresist layer 400 and the anti-reflective coating layer 320 have been removed, and only the flat layer 310 is reserved on the top of the first core layer 300.

Therefore, as shown in FIG. 3, after the first core layer 300 is formed, the flat layer 310 may be directly removed in the same etching machine by using an ashing process. The process is simple, and no transfer machine is needed.

Still referring to FIG. 1, in some implementations, before the top core material layer 305 is formed, the method further includes: forming a second etching stopping layer 220 on the bottom core material layer 205.

Subsequently, the first mask sidewall is formed on the sidewall of the first core layer 300 of the first region 100a, and the second mask sidewall is formed on the sidewall of the first core layer 300 of the second region 100b. The first mask sidewall and the second mask sidewall are usually formed using a process deposition and etching. The top face of the second etching stopping layer 220 is used to define the stopping position of the etching process, to avoid causing etching damage to the film layer below the stopping position, thereby reducing the probability of the height inconsistency problem of the top faces of the to-be-etched film layers below the stopping position, to help improve the etching uniformity of the base 100 subsequently, so that the height and the morphology of the formed target patterns meet the process requirement.

Therefore, the material of the second etching stopping layer 220 and the material of the subsequent first mask sidewall and second mask sidewall have an etching selection ratio, and the etching process of forming the first mask sidewall and the second mask sidewall has a smaller etching rate for the second etching stopping layer 220. In some implementations, the material of the second etching stopping layer 220 is SiO. SiO has lower costs, and higher process compatibility. In other implementations, the material of the second etching stopping layer may also be SiN or SiON.

It should be further noted that, in some implementations, the method further includes: before the second etching stopping layer 220 is formed, forming a third etching stopping layer 210 on the bottom core material layer 205.

The third etching stopping layer 210 is used to further eliminate uncertainty of the etching effect when the first core layer 300 (as shown in FIG. 3) is formed. Specifically, in the procedure for subsequently etching the top core material layer 305 by using the etching process, to form the first core layer 300, even though the second etching stopping layer 220 has etching losses (that is, the heights of the top faces of the second etching stopping layers 220 are different), during etching of the second etching stopping layer 220, the etching process can also be well stopped on the third etching stopping layer 210, or in the procedure for forming the first core layer 300 by using the etching process, even though the second etching stopping layer 220 is etched using the etching process and the third etching stopping layer 210 is exposed, the etching process can also be well stopped on the third etching stopping layer 210, thereby further improving the etching uniformity of the bottom core material layers 205 subsequently.

Therefore, the third etching stopping layer 210 and the second etching stopping layer 220 have a higher etching selection ratio, and the third etching stopping layer 210 and the top core material layer 305 have a higher etching selection ratio.

In some implementations, the material of the third etching stopping layer 210 is a-C. a-C has higher process compatibility with the subsequent manufacturing procedure, and after the bottom core material layer 205 is subsequently etched, the third etching stopping layer 210 can be removed in the same etching machine. The process is simple, and can help improve the manufacturing efficiency.

Specifically, the third etching stopping layer 210 is formed by using a spin coating process.

In some other implementations, the material of the third etching stopping layer may also be SiN. Correspondingly, the third etching stopping layer is formed by using a deposition process. In other implementations, the third etching stopping layer may either not be formed.

Referring to FIG. 4 to FIG. 7, a first mask sidewall 350 is formed on the sidewall of the first core layer 300 on the first region 100a, and a second mask sidewall 360 is formed on the sidewall of the first core layer 300 on the second region 100b, where the thickness of the second mask sidewall 360 is greater than the thickness of the first mask sidewall 350.

Figure 7:
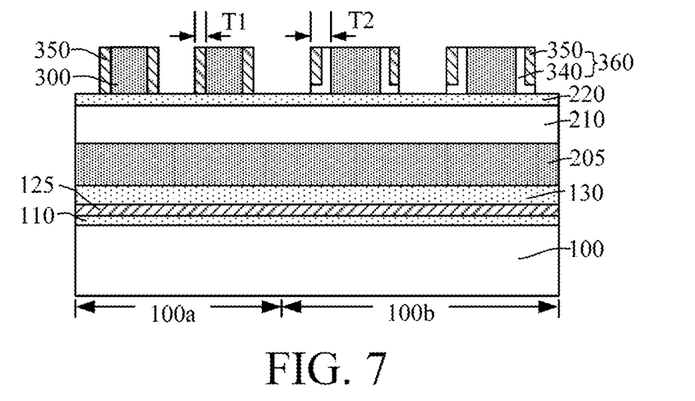

Subsequently, the bottom core material layer 205 is patterned using the first mask sidewall 350 and the second mask sidewall 360 as masks, to form a plurality of discrete second core layers, and then, a third mask sidewall is formed on the sidewall of the second core layer, where the third mask sidewall is used as a mask for patterning the base 100.

In some implementations, patterns are transferred to the second core layer through the first mask sidewall 350 and the second mask sidewall 360, the third mask sidewall is formed on the sidewall of the second core layer, and the patterns are transferred to the base 100 through the third mask sidewall, to form the target patterns. Therefore, the first mask sidewall 350 and the second mask sidewall 360 are used to define the spacer between neighboring target patterns, the thickness of the second mask sidewall 360 is greater than the thickness of the first mask sidewall 350, and the spacer between the target patterns of the second region 100b is correspondingly greater than the spacer between the target patterns of the first region 100a, so that the pitch between the target patterns of the second region 100b is greater than the pitch between the target patterns of the first region 100a.

In some implementations, the first mask sidewall 350 has a first preset thickness T1 (as shown in FIG. 7), and the second mask sidewall 360 has a second preset thickness T2 (as shown in FIG. 7). The first preset thickness T1 and the second preset thickness T2 respectively refer to the size of the first mask sidewall 350 and the size of the second mask sidewall 360 along a direction perpendicular to the sidewall of the first core layer 300. It is defined that the target patterns subsequently formed on the first region 100a have a first preset spacer, and it is defined that the target patterns subsequently formed on the second region 100b have a second preset spacer. The first preset thickness T1 is correspondingly equal to the first preset spacer, and the second preset thickness T2 is correspondingly equal to the second preset spacer.

The following describes the step of forming the first mask sidewall 350 and the second mask sidewall 360 in detail with reference to the accompanying drawings.

Figure 4:
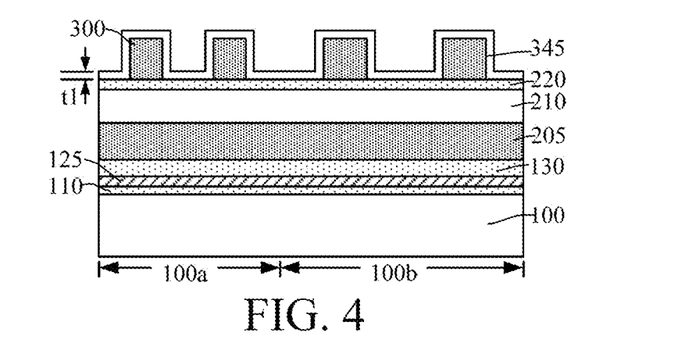

Referring to FIG. 4, a first sidewall film 345 conformally covering the first core layer 300 and the base 100 is formed.

The first sidewall film 345 is used to provide a process foundation for subsequently forming a fourth mask sidewall. The fourth mask sidewall is used as a part of the second mask sidewall. Subsequently, the fourth mask sidewall needs to be further removed. Therefore, the first sidewall film 345 is an easily removed material, and the process of subsequently removing the fourth mask sidewall do less damage to other film layers.

In some implementations, the material of the first sidewall film 345 is SiN. SiN is a mask sidewall material commonly used in the SAQP process. The rigidity and the density of SiN are relatively high, and selecting SiN can help ensure the etching mask effect of the subsequent second mask sidewall. SiN and a-Si have a relatively large etching selection ratio, so that the probability that the subsequent second mask sidewall is damaged in the procedure for removing the first core layer 300 can be reduced.

In some other implementations, when the material of the first core layer is SiN, the material of the first sidewall film may be correspondingly Poly-Si. In other implementations, according to actual situations, the material of the first sidewall film may also be SiO, SiON, CN, SiC, SiCN, or SiOCN.

In some implementations, the first sidewall film 345 has a third preset thickness t1 (as shown in FIG. 4), and the third preset thickness t1 is used to define the difference between the thicknesses of the subsequent second mask sidewall and first mask sidewall. Because the thickness of the first mask sidewall is equal to the first preset spacer, and the thickness of the second mask sidewall is equal to the second preset spacer, correspondingly, the third preset thickness t1 is equal to the difference between the second preset spacer and the first preset spacer.

In some implementations, to improve the uniformity of the third preset thickness t1, thereby improving the thickness uniformity of the subsequently formed fourth mask sidewall, the first sidewall film 345 is formed using an atomic layer deposition process. Moreover, the atomic layer deposition process can be used to help reduce the control difficulty of the third preset thickness t1. In other implementations, the first sidewall film may also be formed using a chemical vapor deposition process.

Figure 5:
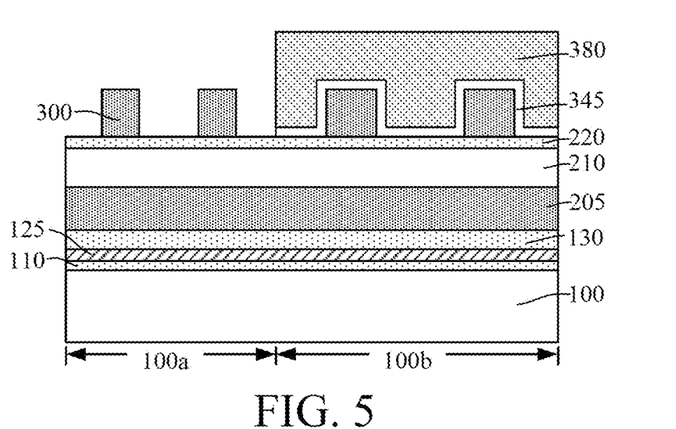

Referring to FIG. 5, the first sidewall film 345 of the first region 100a is removed.

The first sidewall film 345 of the first region 100a is removed, so that the first mask sidewall subsequently formed on the first region 100a has a smaller thickness. Specifically, the step of removing the first sidewall film 345 of the first region 100a includes: forming a second photoresist layer 380, to cover a first sidewall film 345 of the second region 100b; and etching and removing the first sidewall film 345 of the first region 100a using the second photoresist layer 380 as a mask.

In some implementations, the first sidewall film 345 is etched using a dry etching process. The dry etching process has an anisotropic etching property, and can help improve the profile quality of the residual first sidewall film 345.

In some implementations, after the first sidewall film 345 of the first region 100a is removed, the second photoresist layer 380 is removed using an ashing manner or a wet photoresist removing manner.

Figure 6:
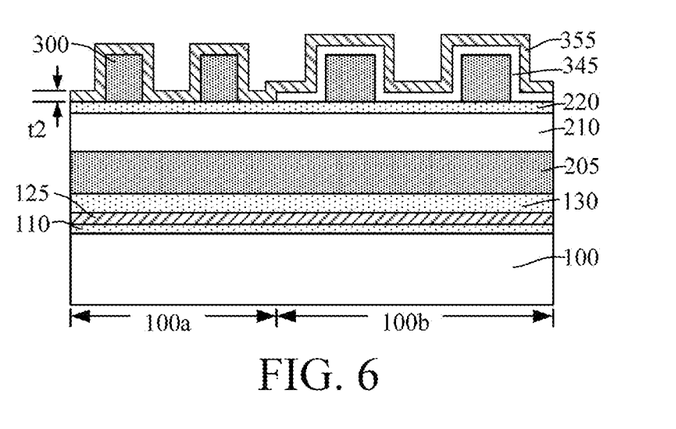

Referring to FIG. 6, after the first sidewall film 345 of the first region 100a is removed, a second sidewall film 355 is formed, to conformally cover the first core layer 300, the base 100, and the residual first sidewall film 345.

Subsequently, the second sidewall film 355 on the sidewall of the first core layer 300 of the first region 100a is reserved as the first mask sidewall. The first mask sidewall is used as a mask for subsequently patterning the bottom core material layer 205 of the first region 100a to form the second core layer.

In some implementations, the material of the second sidewall film 355 is SiN. In some other implementations, when the material of the first core layer is SiN, the material of the second sidewall film may be correspondingly Poly-Si. In other implementations, according to actual situations, the material of the second sidewall film may also be SiO, SiON, CN, SiC, SiCN, or SiOCN. For descriptions of the material of the second sidewall film 355, reference may be made to the foregoing corresponding descriptions of the first sidewall film 345. Details are not described herein again.

The second sidewall film 355 has a fourth preset thickness t2, and the fourth preset thickness t2 is equal to the first preset spacer.

In some implementations, to improve the uniformity of the fourth preset thickness t2, and reduce the control difficulty of the fourth preset thickness t2, the second sidewall film 355 is formed using an atomic layer deposition process. In other implementations, the second sidewall film may also be formed using a chemical vapor deposition process.

Referring to FIG. 7, the top of the first core layer 300 and the second sidewall film 355 and the first sidewall film 345 on the base 100 are removed using a blanket etching process, the residual second sidewall film 355 on the sidewall of the first core layer is reserved as the first mask sidewall 350, and the residual first sidewall film 345 is reserved as the fourth mask sidewall 340. The fourth mask sidewall 340 is located between the first mask sidewall 350 and the first core layer 300 of the second region 100b, and between the first mask sidewall 350 and the bottom core material layer 205 of the second region 100b, and the fourth mask sidewall 340 and the first mask sidewall 350 of the second region 100b construct the second mask sidewall 360.

The first mask sidewall 350 of the first region 100a, and the second mask sidewall 360 of the second region 100b are used as etching masks for subsequently patterning the bottom core material layer 205.

In some implementations, the second sidewall film 355 and the first sidewall film 345 are etched selectively along the surface normal direction of the base 100 using an anisotropic blanket dry etching process, to form the first mask sidewall 350 on the sidewall of the first core layer 300 of the first region 100a, and form the second mask sidewall 360 on the sidewall of the first core layer 300 of the second region 100b.

In some implementations, the material of the first mask sidewall 350 and the material of the second mask sidewall 360 are the same, and both are SiN, so that the etching mask effects of the first mask sidewall 350 and the second mask sidewall 360 are the same.

In some implementations, the second mask sidewall 360 is constructed by the first mask sidewall 350 and the fourth mask sidewall 340 formed on the second region 100b. Therefore, compared with the first mask sidewall 350 formed on the first region 100a, the thickness of the second mask sidewall 360 formed on the second region 100b is larger.

Figure 8:
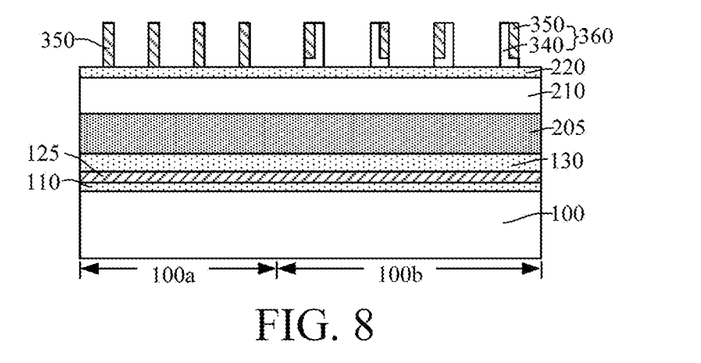

Referring to FIG. 8, the first core layer 300 (as shown in FIG. 7) is removed.

The first core layer 300 is removed to provide a process foundation for subsequently patterning the bottom core material layer 205.

In some implementations, the first core layer 300 is etched and removed using a wet etching process. Specifically, the material of the first core layer 300 is a-Si, and the etching solution used in the wet etching process is a mixing solution of Cl2 and HBr or a TMAH solution. In other implementations, the first core layer may also be removed using a dry etching process, or a process combining dry etching and wet etching.

Figure 9:
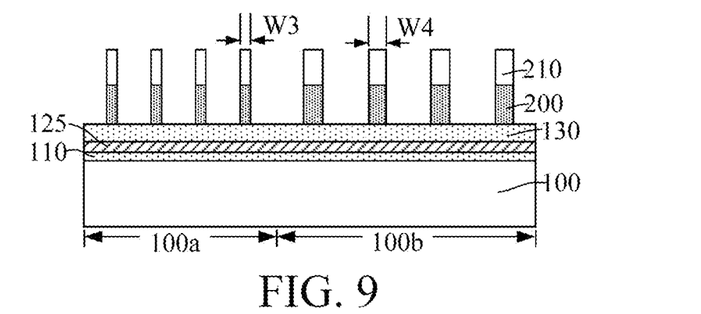

Referring to FIG. 9, after the first core layer 300 (as shown in FIG. 7) is removed, the bottom core material layer 205 (as shown in FIG. 8) is patterned using the first mask sidewall 350 and the second mask sidewall 360 as masks, to form a plurality of discrete second core layers 200.

The second core layer 200 is used to provide a process foundation for subsequently forming a third mask sidewall. In the subsequent manufacturing procedure, the third mask sidewall is formed on the sidewall of the second core layer 200, and the third mask sidewall is used as a mask for patterning the base 100 to form the target patterns.

In some implementations, the material of the second core layer 200 is correspondingly a-Si.

In some implementations, along a direction of the base 100 pointing to the bottom core material layer 205, a third etching stopping layer 210 and a second etching stopping layer 220 are sequentially formed on the bottom core material layer 205. Therefore, by using the first mask sidewall 350 and the second mask sidewall 360 as masks, the second etching stopping layer 220, the third etching stopping layer 210, and the bottom core material layer 205 are sequentially etched using a dry etching process.

In some implementations, the patterns are transferred to the second core layer 200 using the first mask sidewall 350 and the second mask sidewall 360, and the second preset thickness T2 (as shown in FIG. 7) is greater than the first preset thickness T1 (as shown in FIG. 7). Therefore, along the direction perpendicular to the sidewall of the second core layer 200, a width W4 of the second core layer 200 of the second region 100b is greater than a width W3 of the second core layer 200 of the first region 100a.

Specifically, the width W3 of the second core layer 200 of the first region 100a is used to define the spacer between target patterns subsequently formed on the first region 100a, and the width W4 of the second core layer 200 of the second region 100b is used to define the spacer between target patterns subsequently formed on the second region 100b.

It should be noted that, in the pattern transfer procedure, the first mask sidewall 350, the second mask sidewall 360, and the second etching stopping layer 220 also have losses. In some implementations, after the second core layer 200 is formed, the first mask sidewall 350, the second mask sidewall 360, and the second etching stopping layer 220 have all been removed, only the third etching stopping layer 210 is reserved on the top of the second core layer 200.

Figure 10:
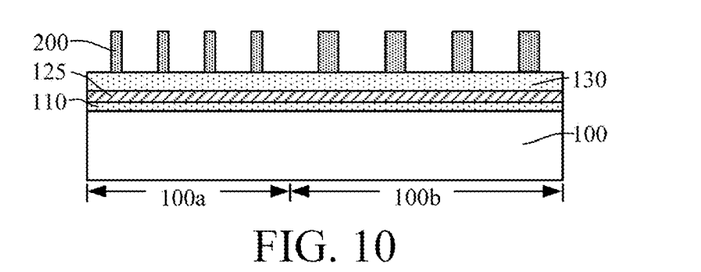

Therefore, referring to FIG. 10, after the second core layer 200 is formed, the method further includes: removing the third etching stopping layer 210. Specifically, the material of the third etching stopping layer 210 is a-C. Therefore, the third etching stopping layer 210 may be directly removed in the same etching machine using an ashing process. The process is simple, and no transfer machine is needed.

Figure 11:
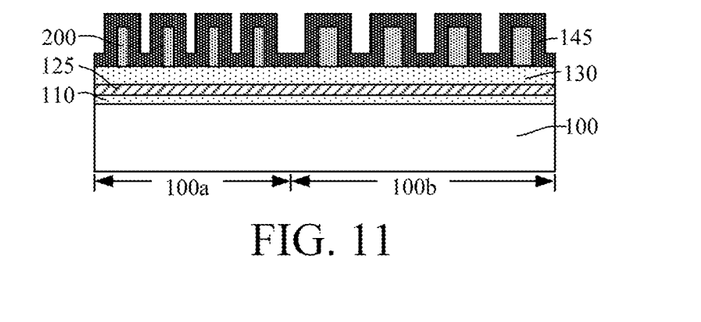
Figure 12:
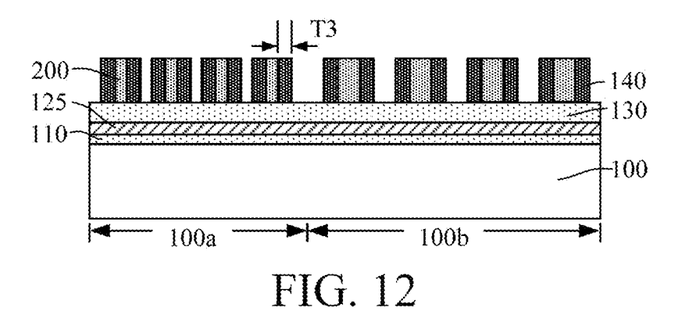

Referring to FIG. 11 and FIG. 12, a third mask sidewall 140 (as shown in FIG. 12) is formed on the sidewall of the second core layer 200.

The third mask sidewall 140 is used as a mask for patterning the base 100. Therefore, a thickness T3 of the third mask sidewall 140 (as shown in FIG. 12) is equal to the width of the target pattern. The thickness T3 of the third mask sidewall 140 refers to the size of the third mask sidewall 140 along the direction perpendicular to the sidewall of the second core layer 200.

In some implementations, the material of the third mask sidewall 140 is SiN. For descriptions of the material of the third mask sidewall 140, reference may be made to the foregoing corresponding descriptions of the first sidewall film 345. Details are not described herein again.

Specifically, the step of forming the third mask sidewall 140 includes: forming a fourth sidewall film 145 conformally covering the second core layer 200 and the base 100; and removing the top of the second core layer 200 and the fourth sidewall film 145 on the base 100 using a blanket etching process, and reserving the residual fourth sidewall film 145 on the sidewall of the second core layer 200 as the third mask sidewall 140. For specific descriptions of the step of forming the fourth mask sidewall 140, reference may be made to the foregoing related descriptions of forming the first mask sidewall 350 (as shown in FIG. 7). Details are not described herein again.

Figure 13:
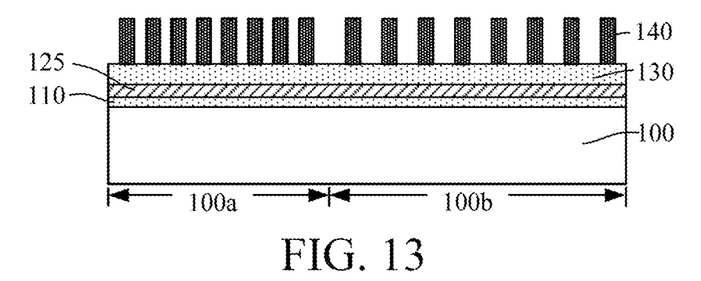

Referring to FIG. 13, the second core layer 200 (as shown in FIG. 12) is removed.

The second core layer 200 is removed to provide a process foundation for subsequently forming the base 100.

In some implementations, the second core layer 200 is etched and removed using a wet etching process. For specific descriptions of the process of removing the second core layer 200, reference may be made to the foregoing corresponding descriptions of removing the first core layer 300 (as shown in FIG. 7). Details are not described herein again.

Figure 14:
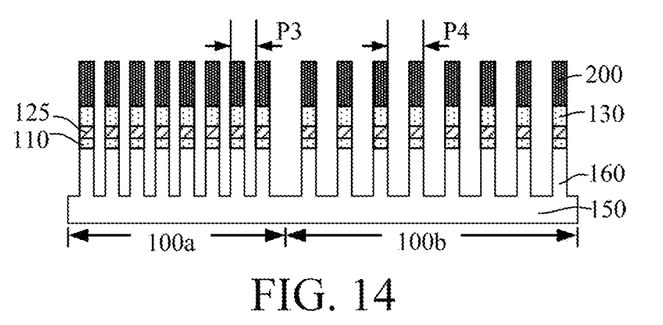
Figure 15:
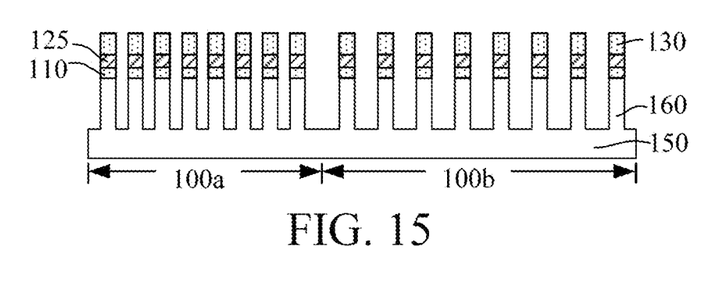

Referring to FIG. 14 and the FIG. 15, after the second core layer 200 (as shown in FIG. 12) is removed, the base 100 (as shown in FIG. 13) is patterned using the third mask sidewall 140 as a mask, to form a plurality of target patterns 160 protruding out of the residual base 100.

Specifically, the first etching stopping layer 130, the lapping stopping layer 125, and the base 100 are sequentially etched using the third mask sidewall 140 as a mask, to form the target patterns 160 protruding out of the residual base 100.

In some implementations, the third mask sidewall 140 is formed on the sidewall of the second core layer 200 (as shown in FIG. 12), and along the direction perpendicular to the sidewall of the second core layer 200, the width W4 (as shown in FIG. 10) of the second core layer 200 of the second region 100b is greater than the width W3 (as shown in FIG. 10) of the second core layer 200 of the first region 100a. Therefore, a pitch P4 between the target patterns 160 of the second region 100b is greater than a pitch P3 between the target patterns 160 of the first region 100a, to meet the requirement of different pitches.

In some implementations, after the base 100 is patterned, the residual base 100 is used as the substrate 150, the target pattern 160 is the fin, and the fin 160 and the substrate 150 are in an integral structure.

In other implementations, when the base includes a first semiconductor layer and a second semiconductor layer epitaxially growing on the first semiconductor layer, in the step of etching the base, only the first semiconductor layer is etched. The first semiconductor layer is used as the substrate, and the residual second semiconductor layer protruding out of the first semiconductor layer is used as the fin. Correspondingly, the material of the fin may also be different from the material of the substrate.

Specifically, the first region 100a is used to form a core device, the second region 100b is used to form an IO device, and the thickness of a gate dielectric layer of the IO device is usually greater than the thickness of a gate dielectric layer of the core device. The pitch between the fins of the second region 100b is made to be greater than the pitch between the fins of the first region 100a, to provide sufficient space for forming the gate dielectric layer corresponding to the IO device. The pitch between the fins located on the first region 100a is still relatively small, to save the area, and avoid affecting the improvement of the device integration.

FIG. 16 to FIG. 20 are schematic structural diagrams corresponding to steps in another form of a method for forming a semiconductor structure.

Figure 20:
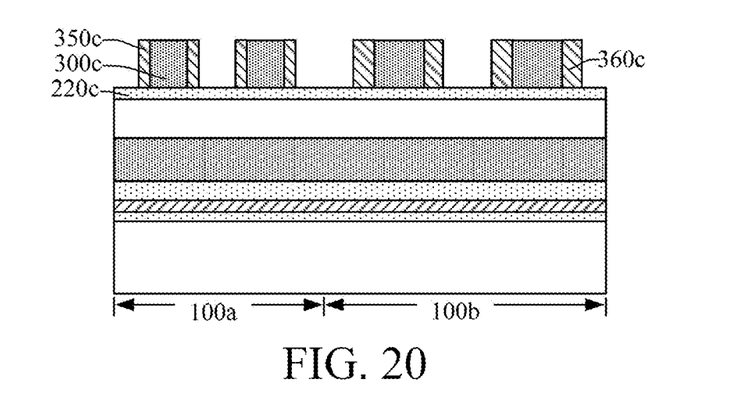

The similarity of some implementations and the foregoing embodiment is not described herein again. The difference of some implementations from the foregoing embodiment lies in: The second mask sidewall 360c (as shown in FIG. 20) is a single layer structure.

Specifically, the forming method includes the following.

Figure 16:
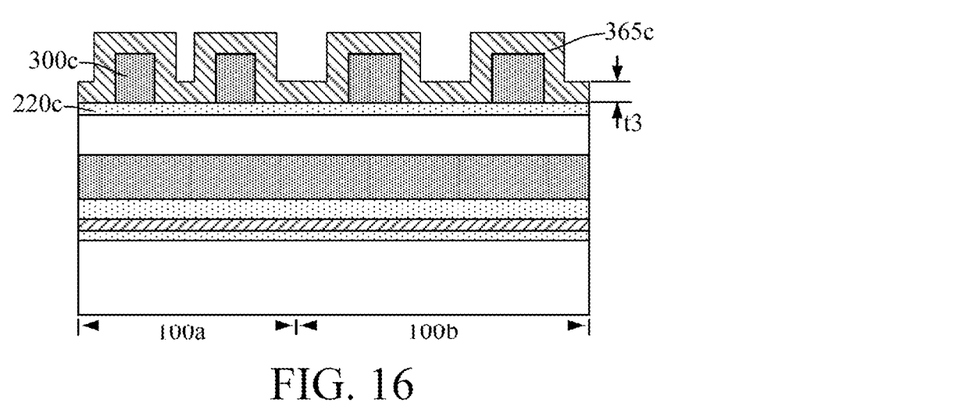
FIG. 16 to FIG. 20 are schematic structural diagrams corresponding to steps in another form of a method for forming a semiconductor structure.

Referring to FIG. 16, after the first core layer 300c is formed, a third sidewall film 365c conformally covering the first core layer 300c and the second etching stopping layer 220c is formed.

The third sidewall film 365 is used to provide a process foundation for subsequently forming a second mask sidewall. The second mask sidewall is used to define the spacer between the target patterns subsequently formed on the second region 100b. Therefore, the thickness t3 of the third sidewall film 365c is determined according to the spacer between the target patterns on the second region 100b.

In some implementations, the material of the third sidewall film 365c is SiN. In other implementations, the material of the third sidewall film may also be SiO, SiON, CN, Poly-Si, SiC, SiCN, or SiOCN.

In some implementations, to improve the uniformity of the thickness t3 of the third sidewall film 365c, and reduce the control difficulty of the thickness t3, the third sidewall film 365c is formed using an atomic layer deposition process. In other implementations, the third sidewall film may also be formed by using a chemical vapor deposition process.

For specific descriptions of the foregoing steps and the third sidewall film 365c, reference may be made to the related descriptions in the foregoing embodiment. Details are not described herein again.

Figure 17:
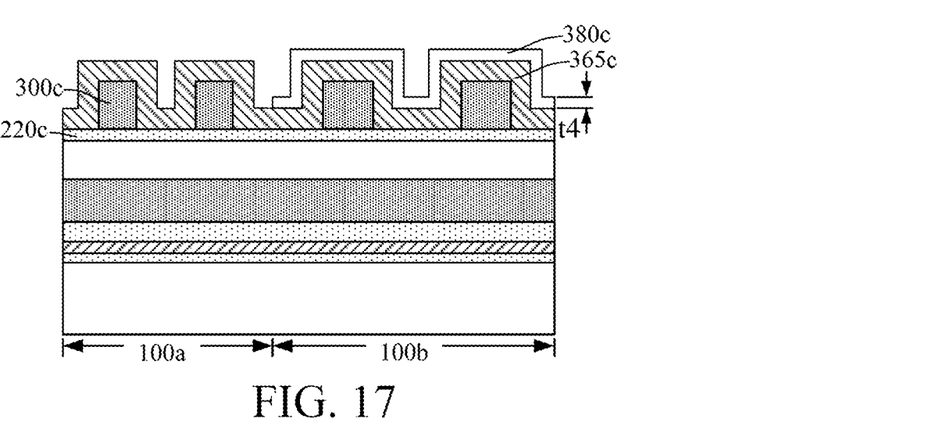

Referring to FIG. 17, a protective layer 380c is formed, to conformally cover the third sidewall film 365c of the second region 100b.

The protective layer 380c is used to protect the third sidewall film 365c of the second region 100b, to avoid affecting the third sidewall film 365c of the second region 100b in the subsequent manufacturing procedure.

It should be noted that, the subsequent step further includes: performing plasma processing on the third sidewall film 365c of the first region 100a. Therefore, the material of the protective layer 380c is selected as: The protective layer 380c can enter a plasma processing machine; and in the plasma processing procedure, the protective layer 380c can have a blocking effect, thereby preventing the plasma processing from affecting the third sidewall film 365c of the second region 100b.

Therefore, in some implementations, the material of the protective layer 380c is SiO. SiO has lower costs, and higher process compatibility, and is easily removed. In other implementations, the material of the protection layer may also be SiON, SiN, Silicon Rich Oxide (SRO), or a-Si.

In some implementations, the protective layer 380c conformally covers the third sidewall film 365c of the second region 100b, thereby avoiding wasting materials, and reducing the process difficulty in subsequently removing the protective layer 380c.

It should be noted that, a thickness t4 of the protective layer 380c should not be excessively small or excessively large. If the thickness t4 is excessively small, the third sidewall film 365c of the second region 100b is easily affected by the subsequent process, thereby changing the thickness t3 (as shown in FIG. 16) of the third sidewall film 365c of the second region 100b, and further affecting the spacer between the target patterns formed on the second region 100b. If the thickness t4 is excessively large, not only the process costs and time are increased, but also the process difficulty in subsequently removing the protective layer 380c is increased. Therefore, in some implementations, the thickness t4 of the protective layer 380c is 2 nm to 10 nm.

In some implementations, the protection layer 380c is formed using an atomic layer deposition process. The atomic layer deposition process has a better step coverage capability, and can improve the forming quality and the conformal coverage capability of the protective layer 380c, and the atomic layer deposition process is used to further help improve the uniformity of the thickness t4 of the protective layer 380c.

Specifically, the step of forming the protective layer 380c includes: forming a protective film (not shown in the figure) conformally covering the third sidewall film 365c, forming a photoresist layer (not shown in the figure) on the protective film, and exposing the protective film of the first region 100a; etching the protective film by using the photoresist layer as a mask, to form the protective layer 380c; and after the protective layer 380c is formed, removing the photoresist layer by using an ashing manner or a wet photoresist removing manner.

It should be noted that, in other implementations, the protective layer may also be formed using a chemical vapor deposition process. Correspondingly, the protective layer further is filled between neighboring first core layers.

Figure 18:
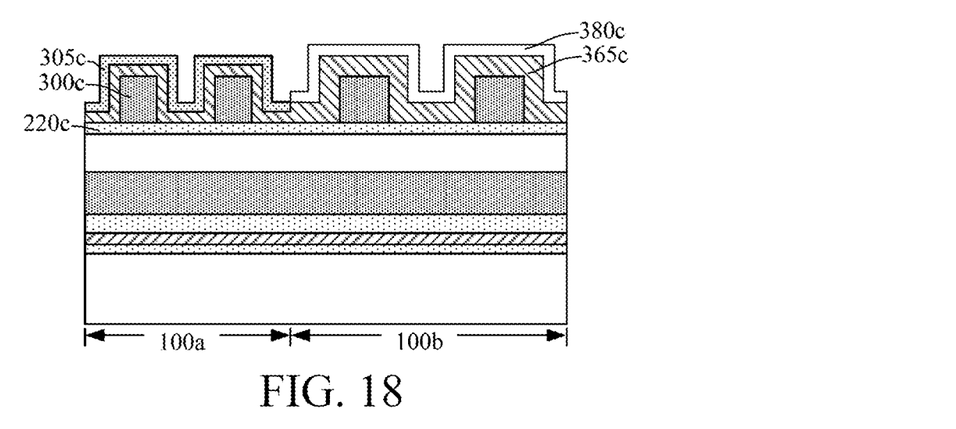

Referring to FIG. 18, after the protective layer 380c is formed, plasma processing is performed on the third sidewall film 365c of the first region 100a, and the third sidewall film 365c of a partial thickness exposed by the protective layer 380c is transformed into the sacrificial layer 305c.

The third sidewall film 365c of the partial thickness of the first region 100a is transformed into the sacrificial layer 305c, so that the thickness of the residual third sidewall film 365c of the first region 100a is less than the thickness of the third sidewall film 365c of the second region 100b. After the target patterns are subsequently formed, the target patterns of the first region 100a have a first preset spacer, and the target patterns of the second region 100b have a second preset spacer. The sacrificial layer 305c has a fourth preset thickness t5, and the fourth preset thickness t5 is correspondingly equal to the difference between the second preset spacer and the first preset spacer.

In some implementations, selecting the plasma processing manner easily makes the fourth preset thickness t meet the process requirement, and helps improve the uniformity of the fourth preset thickness t.

Specifically, the plasma processing is performed in an oxygen atmosphere, that is, the plasma processing is oxygen plasma processing, thereby achieving the effect of oxidizing the third sidewall film 365c of the partial thickness. The process is simple. In some implementations, the material of the third sidewall film 365c is SiN, and the material of the sacrificial layer 305c is SiON.

In other implementations, the plasma processing may also be performed in a hydrogen atmosphere, so that chemical bonds in the material of the third sidewall film 365c of the partial thickness may break down, thereby easily removing the third sidewall film 365c affected by the plasma processing.

Figure 19:
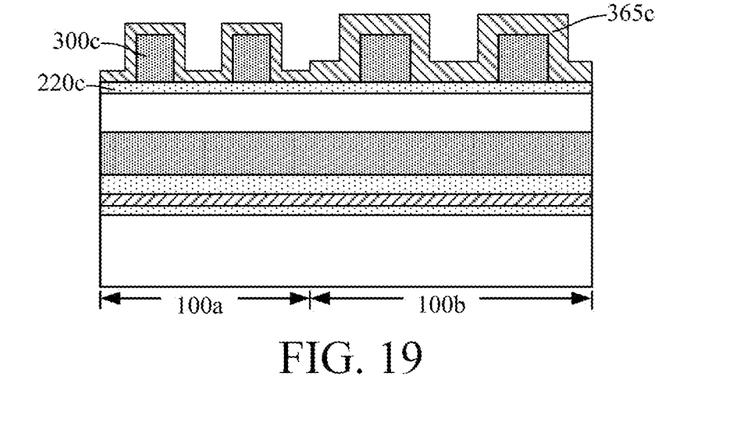

Referring to FIG. 19, the protective layer 380c (as shown in FIG. 18) and the sacrificial layer 305c (as shown in FIG. 18) are removed.

The protective layer 380c and the sacrificial layer 305c are removed to provide a process foundation for subsequently performing etching processing on the third sidewall film 365c. In some implementations, the protective layer 380c and the sacrificial layer 305c are removed using a wet etching process. Specifically, the material of the sacrificial layer 305c is SiON, and the material of the protective layer 380c is SiO. Therefore, the protective layer 380c and the sacrificial layer 305c may be removed in the same process step. The etching solution used in the wet etching process is a dilute hydrofluoric acid (DHF) solution.

Referring to FIG. 20, after the protective layer 380c (as shown in FIG. 18) and the sacrificial layer 305c (as shown in FIG. 18) are removed, the top of first core layer 300c and the third sidewall film 365c (as shown in FIG. 19) on the second etching stopping layer 220c are removed using a blanket etching process, the residual third sidewall film 365c on the sidewall of the first core layer 300c of the first region 100a is reserved as the first mask sidewall 350c, and the residual third sidewall film 365c on the sidewall of the first core layer 300c of the second region 100b is reserved as the second mask sidewall 360c.

Through the foregoing plasma processing, the thickness of the third sidewall film 365c of the first region 100a is less than the thickness of the third sidewall film 365c of the second region 100b. Therefore, the thickness of the first mask sidewall 350c is less than the thickness of the second mask sidewall 360c.

For the descriptions of the subsequent steps, reference may be made to the corresponding descriptions in the foregoing embodiments. Details are not described herein again.

Figure 21:
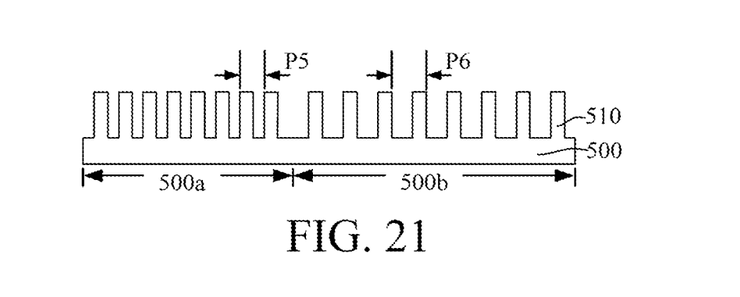
FIG. 21 is a schematic structural diagram of one form of a semiconductor structure.

The present disclosure further provides a semiconductor structure. Referring to FIG. 21, FIG. 21 is a schematic structural diagram of one form of a semiconductor structure.

The semiconductor structure includes: a substrate 500 and a plurality of discrete fins 510 protruding out of the substrate 500. The substrate 500 includes a core region 500a and a peripheral region 500b, and a pitch P6 between the fins 510 located in the peripheral region 500 is greater than a pitch P5 between the fins 510 located in the core region 500a.

In some implementations, the material of the substrate 500 is Si, and the material of the fin 510 is Si. For specific descriptions of the substrate 500 and the fin 510, reference may be made to the corresponding descriptions in the foregoing embodiments. Details are not described herein again.

The core region 500a is used to form a core device, the peripheral region 500b is used to form an IO device, and the thickness of a gate dielectric layer of the IO device is usually greater than the thickness of a gate dielectric layer of the core device. The pitch P6 between the fins 510 located in the peripheral region 500b is greater than the pitch P5 between the fins 510 located in the core region 500a, to provide sufficient space for forming the gate dielectric layer corresponding to the IO device. The pitch P5 between the fins 510 located in the core region 500a is still relatively small, to save the area, and avoid affecting the improvement of the device integration.

The semiconductor structure may be formed using the methods described above for forming a semiconductor structure or formed using other forming methods. For specific descriptions of the semiconductor structure of some implementations, reference may be made to the corresponding descriptions in the foregoing implementations. Details are not described herein again.

Although the present disclosure is described as above, the present disclosure is not limited thereto. Various variations and modifications may be made by any person skilled in the art without departing from the spirit and scope of the present disclosure. Therefore, the protection scope of the present disclosure shall be subject to the scope limited by the claims.

What is claimed is:

1. A method for forming a semiconductor structure, comprising:
    providing a base, used to form target patterns, wherein the base comprises a first region and a second region, and wherein a pitch between target patterns formed on the first region is greater than a pitch between target patterns formed on the second region;
    forming a bottom core material layer on the base;
    forming a plurality of discrete first core layers on the bottom core material layer;
    forming a first mask sidewall on a sidewall of the first core layer of the first region, and forming a second mask sidewall on a sidewall of the first core layer of the second region, wherein a thickness of the second mask sidewall is greater than a thickness of the first mask sidewall;
    removing the first core layers;
    after the first core layers are removed, patterning the bottom core material layer using the first mask sidewall and the second mask sidewall as masks, to form a plurality of discrete second core layers;
    removing the first mask sidewall and the second mask sidewall;
    after the first mask sidewall and the second mask sidewall are removed, forming a third mask sidewall on a sidewall of the second core layer;
    removing the second core layers; and
    after the second core layers are removed, patterning the base using the third mask sidewall as a mask, to form a plurality of target patterns protruding out of a residual base;
    wherein the step of forming the first mask sidewall and the second mask sidewall comprises:
    forming a first sidewall film conformally covering the first core layer and the base;
    removing the first sidewall film of the first region;
    after the first sidewall film of the first region is removed, forming a second sidewall film, to conformally cover the first core layer, the base, and a residual first sidewall film; and
    removing a top of the first core layer and the second sidewall film and the first sidewall film on the base using a blanket etching process, reserving a residual second sidewall film on the sidewall of the first core layer as the first mask sidewall, and reserving the residual first sidewall film as a fourth mask sidewall, wherein the fourth mask sidewall is located between the first mask sidewall and the first core layer of the second region, and between the first mask sidewall and the bottom core material layer of the second region, and the fourth mask sidewall and the first mask sidewall of the second region construct the second mask sidewall.

2. A method for forming a semiconductor structure, comprising:
    providing a base, used to form target patterns, wherein the base comprises a first region and a second region, and wherein a pitch between target patterns formed on the first region is greater than a pitch between target patterns formed on the second region;
    forming a bottom core material layer on the base;
    forming a plurality of discrete first core layers on the bottom core material layer;
    forming a first mask sidewall on a sidewall of the first core layer of the first region, and forming a second mask sidewall on a sidewall of the first core layer of the second region, wherein a thickness of the second mask sidewall is greater than a thickness of the first mask sidewall;
    removing the first core layers;
    after the first core layers are removed, patterning the bottom core material layer using the first mask sidewall and the second mask sidewall as masks, to form a plurality of discrete second core layers;
    removing the first mask sidewall and the second mask sidewall;
    after the first mask sidewall and the second mask sidewall are removed, forming a third mask sidewall on a sidewall of the second core layer;
    removing the second core layers; and
    after the second core layers are removed, patterning the base using the third mask sidewall as a mask, to form a plurality of target patterns protruding out of a residual base;

wherein the step of forming the first mask sidewall and the second mask sidewall comprises:
  forming a third sidewall film conformally covering the first core layer and the base;
  forming a protective layer, to conformally cover the third sidewall film of the second region;
  after the protective layer is formed, performing plasma processing on the third sidewall film of the first region, and transforming the third sidewall film of a partial thickness exposed by the protective layer into a sacrificial layer;
  removing the protective layer and the sacrificial layer; and
  after the protective layer and the sacrificial layer are removed, removing a top of the first core layer and the third sidewall film on the base using a blanket etching process, reserving a residual third sidewall film on the sidewall of the first core layer of the first region as the first mask sidewall, and reserving the residual third sidewall film on the sidewall of the first core layer of the second region as the second mask sidewall.

3. The method for forming a semiconductor structure according to claim 2, wherein a material of the protective layer is SiO, SiON, SiN, SRO, or a-Si.

4. The method for forming a semiconductor structure according to claim 2, wherein the plasma processing is performed in an oxygen atmosphere or a hydrogen atmosphere.

5. The method for forming a semiconductor structure according to claim 2, wherein a thickness of the protective layer is 2 nm to 10 nm.

6. The method for forming a semiconductor structure according to claim 1, wherein:
  in the step of forming the first core layer, the first core layer has a first preset width, and the first core layers in the first region have a first preset pitch;
  in the step of forming the target patterns, the target pattern has a second preset width, and the target patterns in the second region have a second preset pitch; and
  the first preset pitch is quadruple of the second preset pitch, and the first preset width is double equal to a sum of the second preset width.

7. The method for forming a semiconductor structure according to claim 1, wherein:
  in the step of forming the first mask sidewall, the first mask sidewall has a first preset thickness;
  in the step of forming the second mask sidewall, the second mask sidewall has a second preset thickness;
  in the step of forming the target pattern, the target patterns of the first region have a first preset spacer, and the target patterns of the second region have a second preset spacer; and
  the first preset thickness is equal to the first preset spacer, and the second preset thickness is equal to the second preset spacer.

8. The method for forming a semiconductor structure according to claim 1, wherein:
  in the step of forming the first sidewall film, the first sidewall film has a third preset thickness;
  in the step of forming the target pattern, the target patterns of the first region have a first preset spacer, and the target patterns of the second region have a second preset spacer; and
  the third preset thickness is equal to a difference between the second preset spacer and the first preset spacer.

9. The method for forming a semiconductor structure according to claim 2, wherein:
  in the step of forming the sacrificial layer, the sacrificial layer has a fourth preset thickness;
  in the step of forming the target pattern, the target patterns of the first region have a first preset spacer, and the target patterns of the second region have a second preset spacer; and
  the fourth preset thickness is equal to a difference between the second preset spacer and the first preset spacer.

10. The method for forming a semiconductor structure according to claim 1, wherein the step of forming the first core layer comprises:
  forming a top core material layer on the bottom core material layer;
  forming a flat layer on the top core material layer;
  forming an anti-reflective coating layer on the flat layer;
  forming a patterned photoresist layer on the anti-reflective coating layer; and
  patterning the anti-reflective coating layer, the flat layer, and the top core material layer sequentially by using the patterned photoresist layer as a mask, and using a residual patterned top core material layer as the first core layer.

11. The method for forming a semiconductor structure according to claim 1, wherein the method further comprises:
  before the bottom core material layer is formed on the base, forming a first etching stopping layer on the base.

12. The method for forming a semiconductor structure according to claim 11, wherein a material of the first etching stopping layer is SiO, SiN, or SiON.

13. The method for forming a semiconductor structure according to claim 1, wherein the method further comprises:
  before the first core layer is formed on the bottom core material layer, forming a second etching stopping layer on the bottom core material layer.

14. The method for forming a semiconductor structure according to claim 13, wherein a material of the second etching stopping layer is SiO, SiN, or SiON.

15. A method for forming a semiconductor structure, comprising:
  providing a base, used to form target patterns, wherein the base comprises a first region and a second region, and wherein a pitch between target patterns formed on the first region is greater than a pitch between target patterns formed on the second region;
  forming a bottom core material layer on the base;
  forming a plurality of discrete first core layers on the bottom core material layer;
  forming a first mask sidewall on a sidewall of the first core layer of the first region, and forming a second mask sidewall on a sidewall of the first core layer of the second region, wherein a thickness of the second mask sidewall is greater than a thickness of the first mask sidewall;
  removing the first core layers;
  after the first core layers are removed, patterning the bottom core material layer using the first mask sidewall and the second mask sidewall as masks, to form a plurality of discrete second core layers;
  removing the first mask sidewall and the second mask sidewall;
  after the first mask sidewall and the second mask sidewall are removed, forming a third mask sidewall on a sidewall of the second core layer;
  removing the second core layers; and after the second core layers are removed, patterning the base using the third mask sidewall as a mask, to form a plurality of target patterns protruding out of a residual base;

wherein the step of forming the third mask sidewall on the sidewall of the second core layer comprises:

forming a fourth sidewall film conformally covering the second core layer and the base; and removing a top of the second core layer and the fourth sidewall film on the base using a blanket etching process, and reserving a residual fourth sidewall film on the sidewall of the second core layer as the third mask sidewall.

16. The method for forming a semiconductor structure according to claim 1, wherein:

a material of either of the first core layer or the second core layer is a-Si, a-C, a-Ge, SiO, SiON, SiN, CN, Poly-Si, SiC, SiCN, SiOCN, or an ODL material; and a material of any of the first mask sidewall, the second mask sidewall, and the third mask sidewall is SiO, SiON, SiN, CN, Poly-Si, SiC, SiCN, or SiOCN.

17. The method for forming a semiconductor structure according to claim 1, wherein after the base is patterned, the residual base is used as the substrate, and the target pattern is the fin.

18. The method for forming a semiconductor structure according to claim 17, wherein in the step of providing the base, the first region is a core region, and the second region is a peripheral region.

* * * * *